(12) United States Patent
Kim et al.

(10) Patent No.: US 7,759,178 B2
(45) Date of Patent: Jul. 20, 2010

(54) THIN FILM TRANSISTOR SUBSTRATE AND FABRICATION THEREOF

(75) Inventors: Il-gon Kim, Seoul (KR); Tae-hyeong Park, Yongin-si (KR); Kook-chul Moon, Yongin-si (KR); Chul-ho Kim, Yongin-si (KR); Kyung-hoon Kim, Uiwang-si (KR); Su-kyoung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 575 days.

(21) Appl. No.: 11/506,740

(22) Filed: Aug. 18, 2006

(65) Prior Publication Data

US 2007/0040174 A1 Feb. 22, 2007

(30) Foreign Application Priority Data

Aug. 18, 2005 (KR) .................. 10-2005-0075690

(51) Int. Cl.
*H01L 21/84* (2006.01)
(52) U.S. Cl. .................. 438/151; 438/159; 438/164; 257/E29.151
(58) Field of Classification Search .......... 438/151, 438/159, 164; 257/E29.151
See application file for complete search history.

(56) References Cited

U.S. PATENT DOCUMENTS

2006/0132665 A1* 6/2006 Park ..................... 349/28
2007/0045627 A1* 3/2007 Park et al. .............. 257/66
2007/0114537 A1* 5/2007 Yamazaki et al. ......... 257/72
2007/0210312 A1* 9/2007 Nakajima et al. ......... 257/59
2007/0252206 A1* 11/2007 Yamazaki et al. ........ 257/347
2008/0042584 A1* 2/2008 Ohtani .................. 315/169.3
2008/0265786 A1* 10/2008 Koyama ................ 315/169.3
2009/0026970 A1* 1/2009 Ohtani .................. 315/169.3
2009/0072238 A1* 3/2009 Yamazaki et al. ......... 257/72
2009/0075460 A1* 3/2009 Ohtani et al. ........... 438/487

FOREIGN PATENT DOCUMENTS

| CN | 1460979 A | 12/2003 |
|---|---|---|
| JP | 2002-134756 | 5/2002 |
| JP | 20003-45889 | 2/2003 |
| KR | 10-0355713 | 9/2002 |

OTHER PUBLICATIONS

Patent Abstracts of Japan, Publication No. 2002-134756, May 10, 2002, 2 pp.
Patent Abstracts of Japan, Publication No. 2003-045889, Feb. 14, 2003, 2 pp.
Korean Patent Abstracts, Registration No. 10-0355713, Sep. 25, 2002, 1 p.

* cited by examiner

*Primary Examiner*—Ngan Ngo
(74) *Attorney, Agent, or Firm*—Innovation Counsel LLP

(57) ABSTRACT

A thin film transistor substrate having a semiconductor layer including a low concentration region and a source region/drain region adjacent to the low concentration region at both sides of a channel region made of polysilicon; a gate insulating layer and a conductive layer on the substrate the conductive layer patterned to form a gate electrode.

14 Claims, 15 Drawing Sheets

THIN FILM TRANSISTOR SUBSTRATE AND FABRICATION THEREOF

REFERENCE TO RELATED APPLICATION

This application claims priority from Korean Patent Application No. 10-2005-0075690 filed on Aug. 18, 2005 in the Korean Intellectual Property Office, the disclosure of which is incorporated herein by reference.

FIELD OF THE INVENTION

The present invention relates to a thin film transistor substrate and, more particularly, to a fabrication method therefor.

DESCRIPTION OF THE RELATED ART

Recently, LCDs have been employed as display devices in a wide variety of applications such as notebook-type computers or portable devices. The methods for driving LCDs are shifting from simple to active matrix type in which a plurality of thin film transistors (TFT) formed on a glass substrate are used for driving the pixel electrodes of the LCD. The TFT includes a semiconductor layer, a gate electrode connected to the gate line, a source electrode connected to the data line, and a drain electrode connected to the pixel electrode. TFTs are used as switching elements for controlling picture signals applied through the data line to be transmitted to or blocked from the pixel electrode according to scan signals applied through the gate line.

The semiconductor layer is made of amorphous silicon or polysilicon. A TFT is divided into a top-gate type and a bottom-gate type according to its location relative to a gate electrode. In a TFT having a semiconductor layer made of polysilicon, a top-gate type is widely used, in which a gate electrode is disposed over the semiconductor layer.

Polysilicon TFTs have high-speed switching capabilities compared to amorphous silicon TFTs and have the advantage in that the pixel and driver TFTS can be formed together. However, the polysilicon TFR can be subject to "punch-through" which makes it necessary to form lightly doped regions between a channel region and source and drain regions to reduce the punch-through effect. The photo-etching process for producing a lightly doped drain (LDD) region and the photo-etching process for a highly doped drain (HDD) region are required to be separately performed. In addition, misalignment occurring during photo-etching may result in a difference in the size between LDD regions adjacent to the source and drain regions, thereby degrading the TFT's characteristics.

SUMMARY OF THE INVENTION

The present invention provides a thin film transistor substrate with improved characteristics and better means of fabrication in which the semiconductor layer has a low concentration region and a source region/drain region adjacent to the low concentration region at both sides of a channel region made of polysilicon. According to an aspect of the present invention, there is provided a thin film transistor (TFT) substrate including a first semiconductor layer formed on a substrate and including a low concentration region of a first conductivity type and a source region/drain region of the first conductivity type adjacent to the low concentration region at both sides of a channel region made of polysilicon. A second semiconductor layer includes low concentration regions of the first conductivity type at either side thereof. A gate insulating layer is formed on the first and second semiconductor layers. A first gate electrode overlaps a portion of the first semiconductor layer and a second gate electrode overlaps the channel region formed in the second semiconductor layer. The low concentration region, a source region and a drain region can be formed within a semiconductor layer using a single mask. The high concentration impurity ions are directly doped into the semiconductor layer, ion implantation being performed at relatively low ion implant energy. This, the gate overlapped, lightly doped drain (GOLDD) structure is achieved without additional processing steps, thereby simplifying the fabrication method and reducing production cost.

BRIEF DESCRIPTION OF THE DRAWING

The above and other features and advantages of the present invention will become more apparent from a reading of the ensuing description together with the drawing, in which.

DETAILED DESCRIPTION

Figure 1:
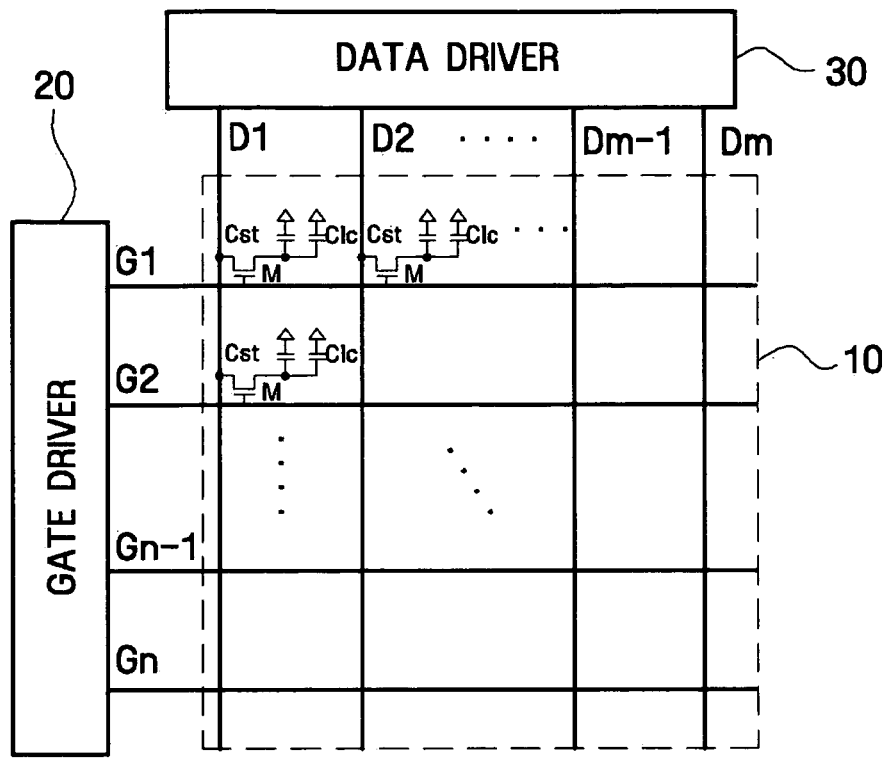
FIG. 1 is a schematic diagram of a TFT substrate according to an embodiment of the present invention.

Like reference numerals refer to like elements throughout the specification. A thin film transistor (TFT) substrate according to an embodiment of the present invention will now be described with reference to FIG. 1. FIG. 1 is a schematic block diagram of a TFT substrate according to an embodiment of the present invention. Referring to FIG. 1, the TFT substrate includes a pixel area 10, a gate driver 20, a data driver 30, and a timing controller 30. The pixel area 10 includes a plurality of pixels connected to a plurality of gate lines G1 through Gn and a plurality of data lines D1 through Dm, the plurality of pixels including a plurality of switching elements M connected to the plurality of gate lines G1 through Gn and the plurality of data lines D1 through Dm, liquid crystal capacitors Clc connected thereto, and storage capacitors Cst.

The plurality of gate lines G1 through Gn arranged in the row direction transmit gate signals to the switching elements M. The plurality of data lines D1 through Dm transmit gray voltages corresponding to data signals to the switching elements M. Switching elements M are three-terminal elements having control terminals connected to gate lines G1 through Gn, input terminals connected to data lines D1 through Dm, and output terminals connected either to liquid crystal capacitors Clc or to storage capacitors Cst. Liquid crystal capacitors Clc may be connected between output terminals of switching elements M and a common electrode (not shown), and storage capacitors Cst may be independently wired between output terminals of the switching elements M and the common electrode, or they may be connected between output terminals of the switching elements M and each of the previous gate lines G1 through Gn.

Gate driver 20 is connected to the plurality of gate lines G1 through Gn, and provides the plurality of gate lines G1 through Gn with scan signals that activate the switching elements M. Data driver 30 is connected to the plurality of data lines D1 through Dm. MOS thin film transistors may be used as the switching elements M. The MOS transistors may also be used as gate driver 20 or data driver 30. In such MOS transistors, channel regions are formed using amorphous silicon or polycrystalline silicon.

Figure 2:
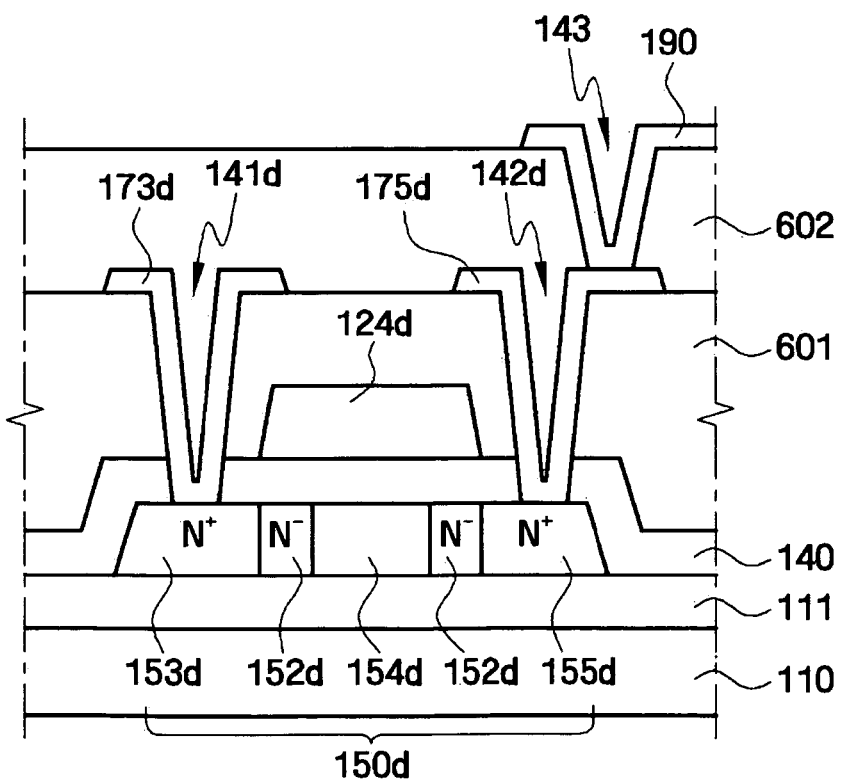
FIG. 2 is a cross-sectional view illustrating a pixel area in the TFT substrate according to an embodiment of the present invention.
Figure 3:
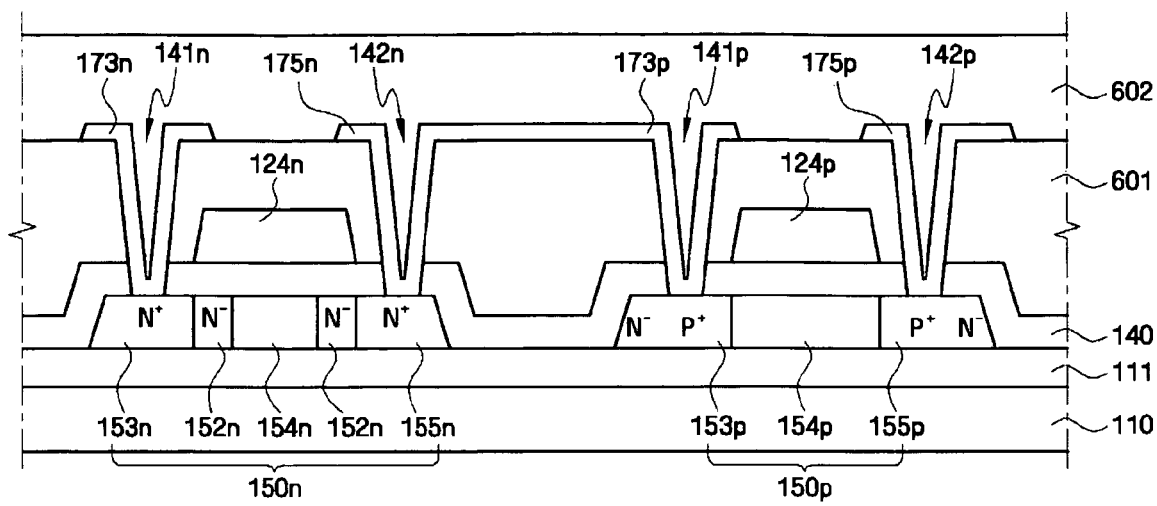
FIG. 3 is a cross-sectional view of a CMOS device having a PMOS and a NMOS, illustrating a drive area of in the TFT substrate according to an embodiment of the present invention.

Referring to FIGS. 2 and 3, a TFT substrate having channel regions formed using polycrystalline silicon according to an embodiment of the present invention will now be described. FIG. 2 is a cross-sectional view of a pixel area of the TFT substrate, and FIG. 3 is a cross-sectional view of the drive area of the TFT substrate, illustrating the structure of a CMOS (Complementary Metal-Oxide Semiconductor) device having a PMOS (P-channel Metal-Oxide Semiconductor) and a NMOS (N-channel Metal-Oxide Semiconductor).

As shown in FIGS. 2 and 3, a blocking layer 111 made of silicon oxide ($SiO_2$) or silicon nitride (SiN) is formed on a transparent insulating substrate 110. A semiconductor layer 150d made of polysilicon is formed on the blocking layer 111 in the pixel area. Semiconductor layer 150d includes a source region 153d and a drain region 155d doped with high concentration n-type impurities labeled $N^+$, an undoped channel region 154d disposed between the source region 153d and the drain region 155d.

Similarly, semiconductor layers 150n and 150p made of polysilicon for a CMOS device including an NMOS and a PMOS are formed in the drive area. Semiconductor layers 150n and 150p each include a source region 153n, 153p, a drain region 155n, 155p doped with high concentration n- and p-type impurities labeled $N^+$ and $P^+$, respectively, and an undoped channel region 154n, 154p disposed between the source region 153n, 153p and the drain region 155n, 155p.

In the NMOS, a low concentration region 152n doped with n-type impurities labeled $N^-$ is formed between the source region 153n and the drain region 154n and between the drain region 154n and the drain region 155n. Meanwhile, in the PMOS, a low concentration region doped with n-type impurities labeled $N^-$ is formed at either side of semiconductor layer 150p.

A gate insulating layer 140 made of polycrystalline silicon is formed on substrate 110 having semiconductor layers 150d, 150n and 150p. Gate insulating layer 140 may be formed as a single layer made of, for example, silicon oxide or silicon nitride or a multiple layer (not shown) including silicon oxide and silicon nitride area sequentially stacked. Gate insulating layer 140 entirely covers semiconductor layers 150d, 150n and 150p and includes first and second contact holes 141d, 141n, 141p, 142d, 142n and 142p for electrically connecting the source and drain regions 153n and 155n of semiconductor layer 150d in the pixel area, the source and drain areas 153n, 153p, 154n and 154p of semiconductor layers 150n and 150p in the drive area with source and drain electrodes 173d, 173n, 173p, 175d, 175n and 175p, which will later be described.

A gate line (not shown) extends in one direction on gate insulating layer 140 in the pixel area, and a portion of the gate line is branched and overlaps with the channel region 154d and the low concentration region 152d of semiconductor layer 150d. The portion of the gate line is used as a gate electrode 124d for a TFT. An end of the gate line can be formed wider than a width of the gate line to be connected with an external circuit (not shown) or directly be connected with the output end of a gate driver circuit.

In addition, an NMOS gate electrode 124n formed on gate insulating layer 140 in the drive area overlaps the channel region 154n formed on semiconductor layer 150n and the low concentration region 152n. A PMOS gate electrode 124p overlaps the channel region 154p formed on semiconductor layer 150p. In such a way, a gate that overlaps the lightly doped drain structure (GOLDD) structure is achieved. A TFT having such a GOLDD structure can mitigate the electric field applied in the source or drain region junction, thereby improving deterioration of the TFT due to generation of hot carriers in the channel regions by effectively diffusing the hot carriers.

A first interlayer insulating layer 601 is formed on the resultant structure having gate electrodes 124d, 124n and 124p. The first interlayer insulating layer 601 includes contact holes constituted by the first and second contact holes 141d, 141n, 141p, 142d, 142n and 142p for electrically connecting the source and drain regions 153d, 153n, 153p, 155d, 155n, 155p with source and drain regions 173d, 173n, 173p, 175d, 175n and 175p.

A data line (not shown) defining a pixel area and intersecting the gate line is formed on the first interlayer insulating layer 601. A portion or branch of the data line is connected with the source region 153d through the first contact hole 141d. The portion of the data line connected with the source region 153d is used as the source electrode 173d for the TFT. The drain electrode 175d is separated a predetermined distance apart from and disposed at the same level as the source electrode 173d and connected with the drain region 155d through the second contact hole 142d. An end of the data line can be formed that is wider to facilitate connection with an external circuit (not shown) or the data line can be directly connected with the output end of a data driver circuit.

In the drive area of the first interlayer insulating layer 601, the source electrodes 173n and 173p for NMOS and PMOS TFTs are formed to be electrically connected with the source regions 153n and 153p through the first contact holes 141n and 141p, respectively. The drain electrodes 175n and 175p are separated from and opposite to the source electrodes 173n and 173p with respect to the channel regions 154n and 154p through the second contact holes 142n and 142p, respectively. Drain electrode 175n for the NMOS TFT is connected with the source electrode 173p for the PMOS TFT.

A second interlayer insulating layer 602 is formed on the first interlayer insulating layer 601 having the source electrodes 173d, 173n and 173p, the drain electrodes 175d, 175n and 175p and the data line. A pixel electrode 190 connected with the drain electrode 175d through the third contact hole 143 is formed on each pixel region provided on the second interlayer insulating layer 602 in the pixel area.

Figure 4:
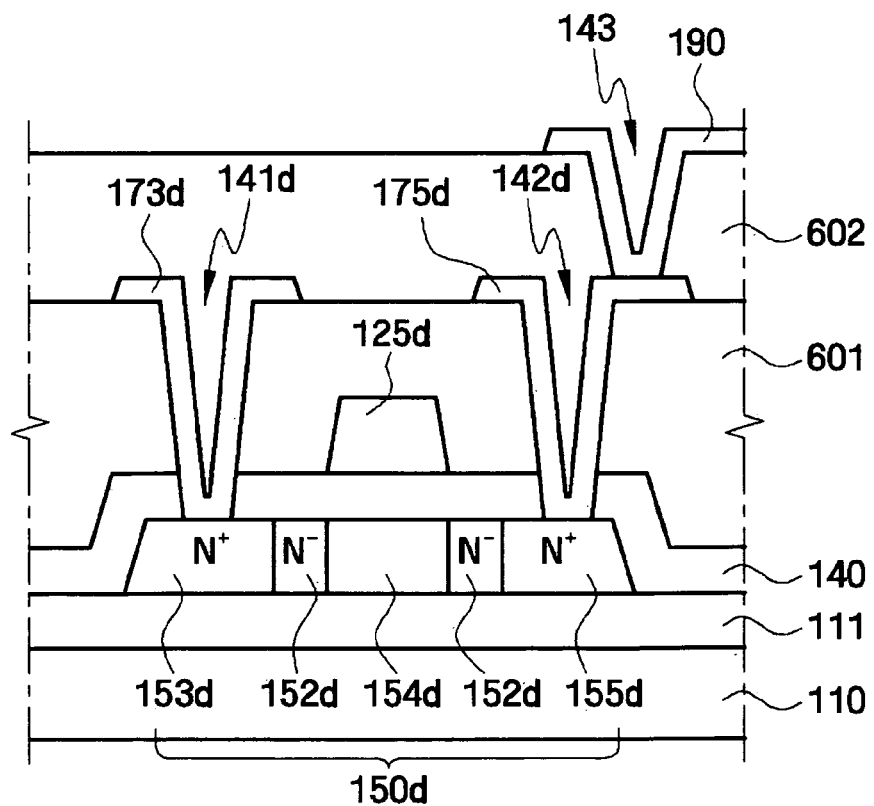
FIG. 4 is a cross-sectional view illustrating a pixel area in the TFT substrate according to another embodiment of the present invention.
Figure 5:
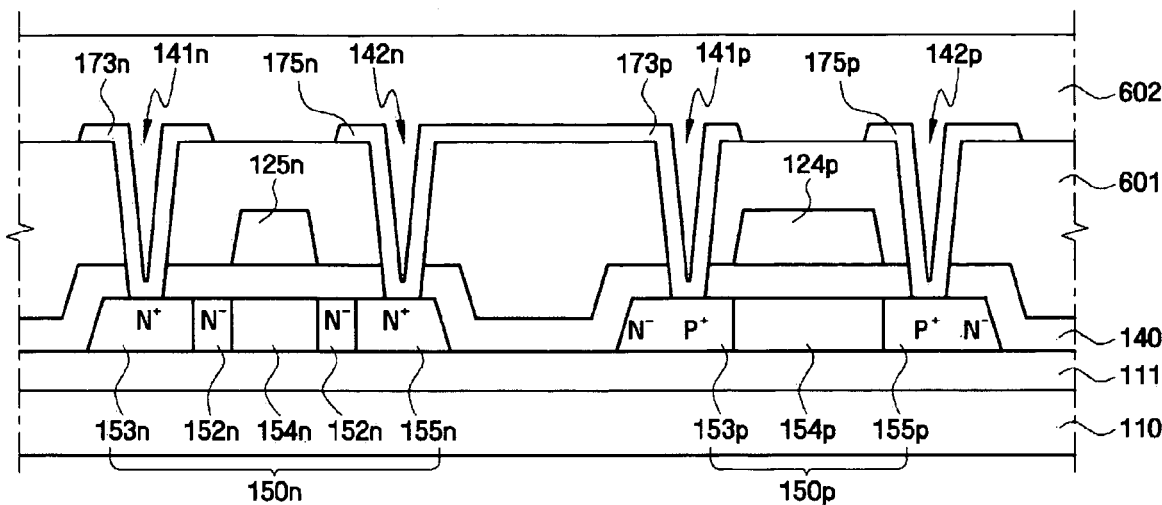
FIG. 5 is a cross-sectional view of a CMOS device having a PMOS and a NMOS, illustrating a drive area of in the TFT substrate according to another embodiment of the present invention.

Hereinafter, a TFT substrate having channel regions formed using polycrystalline silicon according to another embodiment of the present invention will be described with reference to FIGS. 4 and 5. FIG. 4 is a cross-sectional view of a pixel area in the TFT substrate and FIG. 5 is a cross-sectional view of a drive area in the TFT substrate. Referring to FIGS. 4 and 5, the TFT substrate is the same as the previously described TFT substrate except that a gate electrode 124d in the pixel area and an NMOS gate electrode 124n in the drive area overlap channel regions 154d and 154n formed in the respective semiconductor layers 150d and 150n, respectively, and thus any repeated description will not be given.

Figure 6:
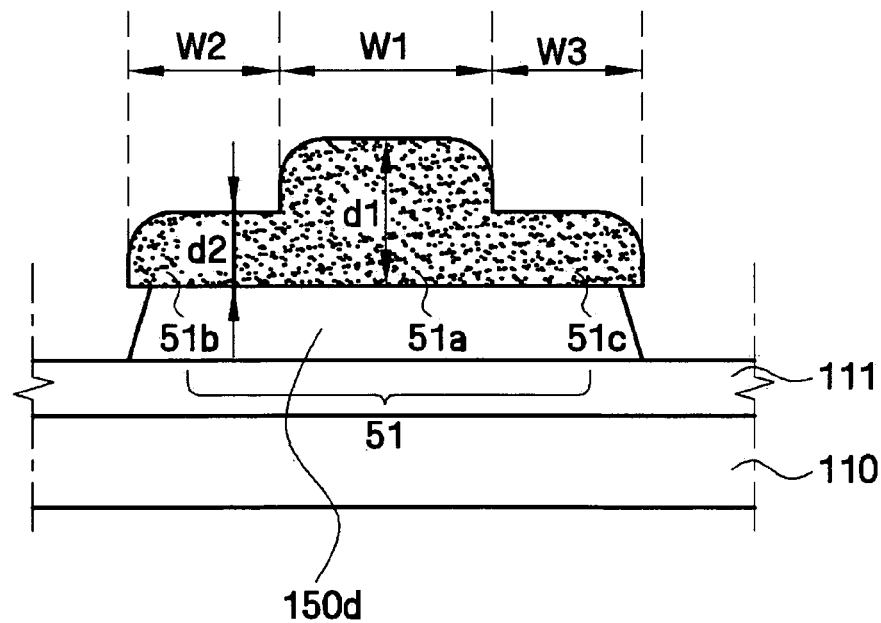
FIGS. 6, 8, 10, 12, 14, 16, 18 and 20 are cross-sectional views of intermediate structures in a pixel area in various steps to manufacture the TFT substrate according to an embodiment of the present invention.
Figure 7:
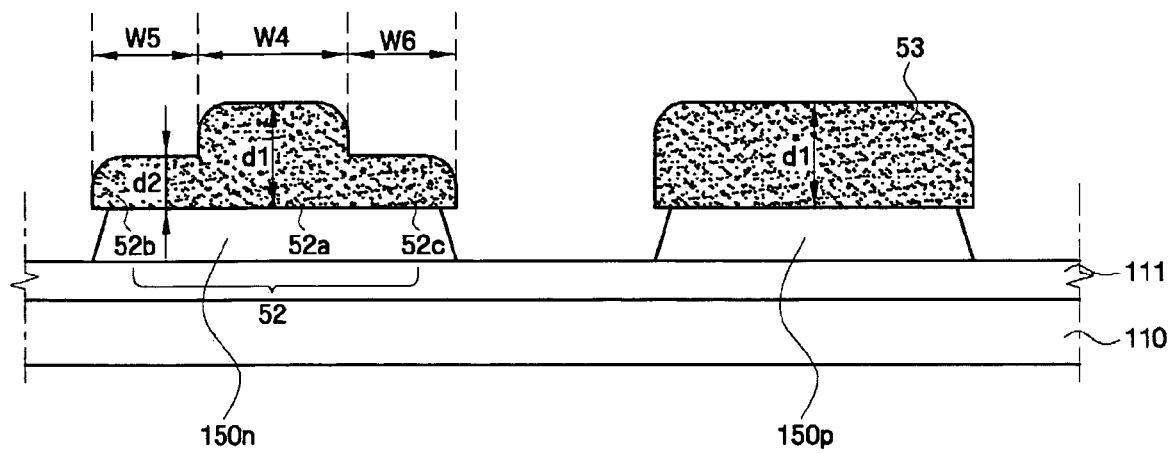
FIGS. 7, 9, 11, 13, 15, 17, 19 and 21 are cross-sectional views of intermediate structures in a drive area in various steps to manufacture the TFT substrate according to an embodiment of the present invention.

Methods of manufacturing the above-mentioned TFT substrates will be described with reference to the accompanying drawings. FIGS. 6, 8, 10, 12, 14, 16, 19 and 20 are cross-sectional views of intermediate structures in a pixel area in various steps to manufacture a TFT substrate, and FIGS. 7, 9, 11, 13, 15, 17, 18 and 21 are cross-sectional views of intermediate structures in a drive area in various steps to manufacture a TFT substrate. Referring to FIGS. 6 and 7, a blocking layer 111 is formed on a transparent insulating substrate 110. Transparent insulating substrate 110 can be made of glass, quartz, sapphire, etc. Blocking layer 111 is formed for the purpose of preventing impurities from being diffused into semiconductor layers 150d, 150n, and 150p. Blocking layer 111 is formed by depositing silicon oxide ($SiO_2$) or silicon nitride ($SiN_x$) onto the insulating substrate 110 with a thickness of about 5000 Å. Then, the surface is cleaned to remove impurities such as a natural oxide layer from the blocking layer 111.

An intrinsic amorphous silicon layer is deposited to a thickness of about 500 Å to form an amorphous silicon layer. Then, the amorphous silicon layer is crystallized by excimer laser annealing (ELA), sequential lateral solidification (SLS), metal induced crystallization (MIC), or metal induced lateral crystallization (MILC). Next, a photoresist layer is formed on the crystallized polycrystalline silicon layer. Then, the resultant photoresist layer is exposed and developed through photolithography using a slit mask or a halftone mask (not shown) to form photoresist patterns 51, 52 and 53 having a predetermined shape. For example, photoresist patterns 51, 52 and 53 may be formed by patterning the photoresist layer in a predetermined shape, heating and shrinking so that the sectional shapes of photoresist patterns 51, 52 and 53 are trapezoidal. Alternatively, a molten photoresist layer may be heated, followed by patterned in a variety of sectional shapes including semispherical sections. Photoresist patterns 51, 52 and 53 are may be used not only as etch masks for patterning the polycrystalline silicon layers into semiconductor layers but also as ion implantation masks for implanting n-type impurity ions.

Photoresist pattern 51 formed on the polycrystalline silicon layer in the pixel area has a double layered structure consisting of a high-level portion 51a having a first thickness d1, and low-level portions 51b and 51c having a second thickness d2. A width w1 of the high-level portion 51a of photoresist pattern 51 varies according to a width of a channel region and low concentration region to be formed, i.e., 154d and 152d of FIG. 2, in a semiconductor layer, i.e., 150d of FIG. 2. In addition, an overall width of photoresist pattern 51, i.e., w1+w2+w3, varies according to the width of the semiconductor layer to be formed, i.e., 150d of FIG. 2.

Of photoresist patterns 52 and 53 formed on the polycrystalline silicon layer in the drive area, photoresist pattern 52 for patterning the NMOS semiconductor layer has a double layered structure consisting of a high-level portion 52a having a first thickness d 1, and low-level portions 52b and 52c having a second thickness d2, the low-level portions 52b and 52c being disposed at either side of the high-level portion 52a. Photoresist pattern 53 for patterning the PMOS semiconductor layer has a single layered structure consisting of a high-level portion having a first thickness d1. A width w4 of the high-level portion 52a of photoresist pattern 52 for patterning the PMOS semiconductor layer varies according to a width of a channel region to be formed, i.e., 150n of FIG. 2, in an NMOS semiconductor layer, i.e., 152 of FIG. 2, and a width of a low concentration region 152n, like in the pixel area. In addition, an overall width of photoresist pattern 52, i.e., w4+w5+w6, varies according to the width of the NMOS semiconductor layer to be formed, i.e., 150n of FIG. 2. Subsequently, the polycrystalline silicon layer is patterned using photoresist patterns 51, 52 and 53 formed on the polycrystalline silicon layer as etch masks, thereby completing the formation of semiconductor layers 150d, 150n and 150p.

Figure 8:
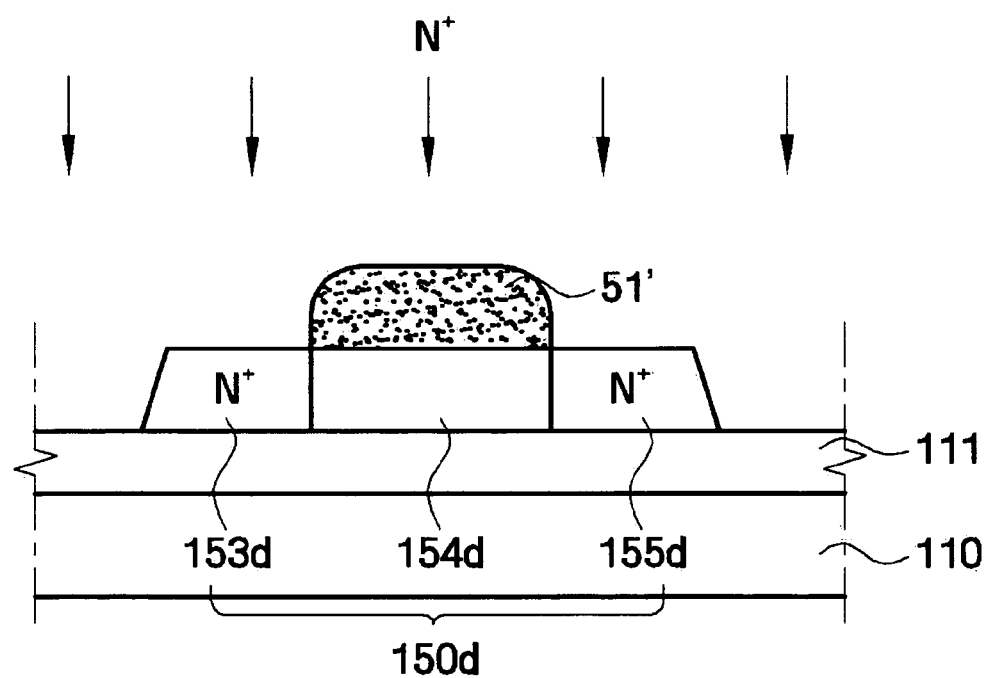
Figure 9:
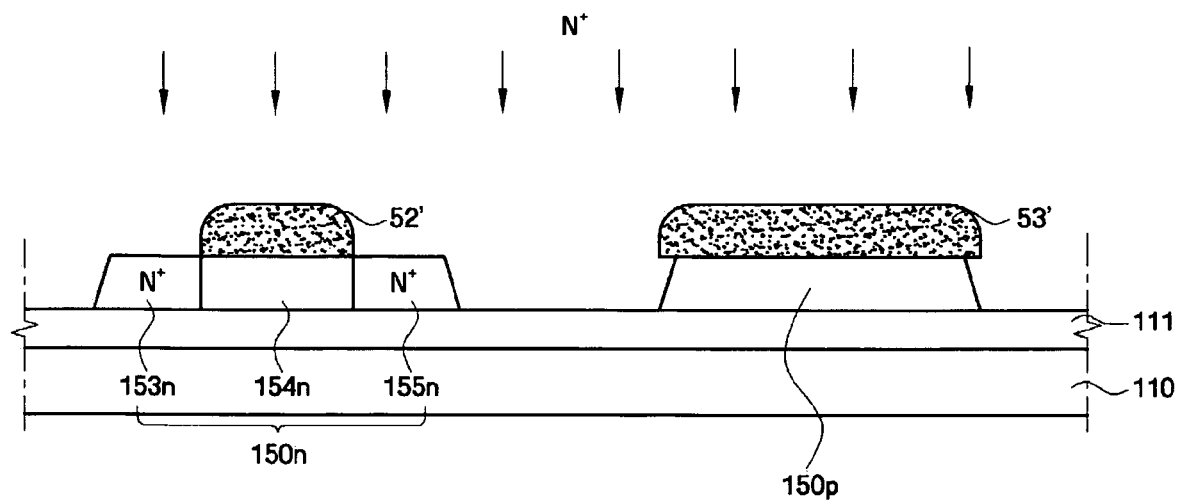

Referring to FIGS. 8 and 9, the photoresist patterns are etched by ashing through oxygen plasma treatment until the low-level portions 51a, 51b, 52a and 52b are removed. Subsequently, high concentration n-type impurities labeled $N^+$ are implanted into the pixel area and semiconductor layers 150d and 150n for an NMOS using ashed photoresist patterns 51', 52', and 53' as ion implantation masks to form source regions 153d, 153n, drain regions 155d and 155n, and channel regions 154d and 154n, respectively. Here, the channel regions 154d and 154n correspond to semiconductor layers 150d and 150n overlaying photoresist patterns 51' and 52', so that impurity ions are not injected into the channel regions 14d and 154n, serving to isolate the source regions 153d and 153n and the drain regions 155d and 155n from each other.

Photoresist pattern 53' precludes impurity ions from being injected into the PMOS semiconductor layer 150p overlying photoresist pattern 53'. Hydrogen-diluted phosphine ($PH_3$), for example, may be used as a source gas for ion implantation, and the dosage and ion implant energy thereof may be adjusted appropriately according to device characteristics. While high concentration n-type impurities ($N^+$) have conventionally been implanted into a semiconductor substrate with a gate insulating layer, according to the present invention, high concentration impurity ion implantation is performed on a semiconductor substrate without an upper layer, enabling impurity ion implantation to be performed at relatively low ion implant energy.

Figure 10:
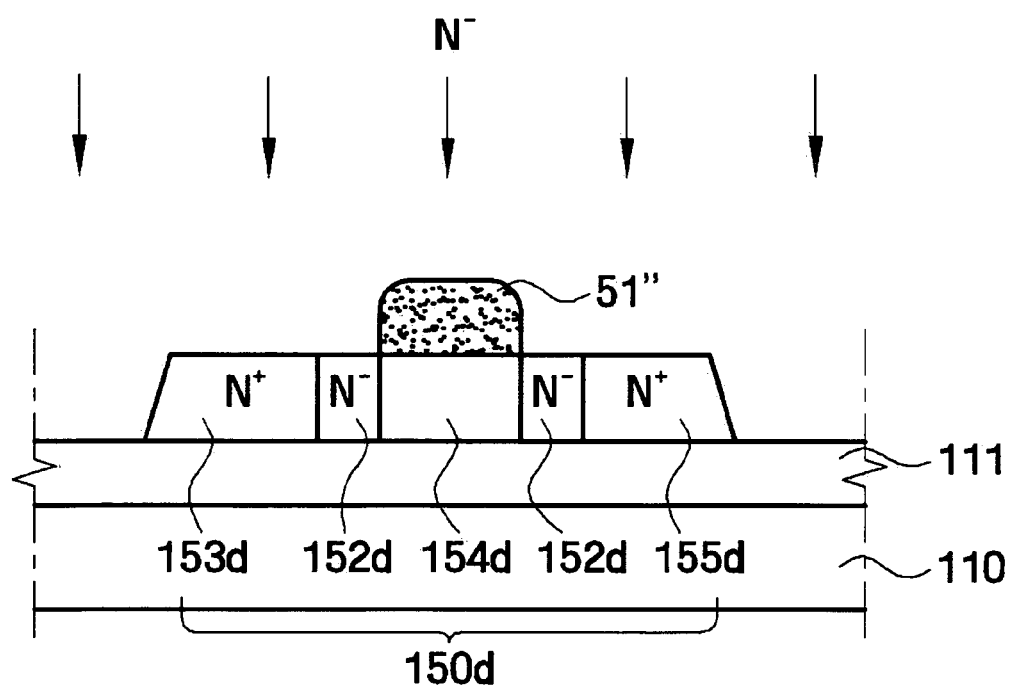
Figure 11:
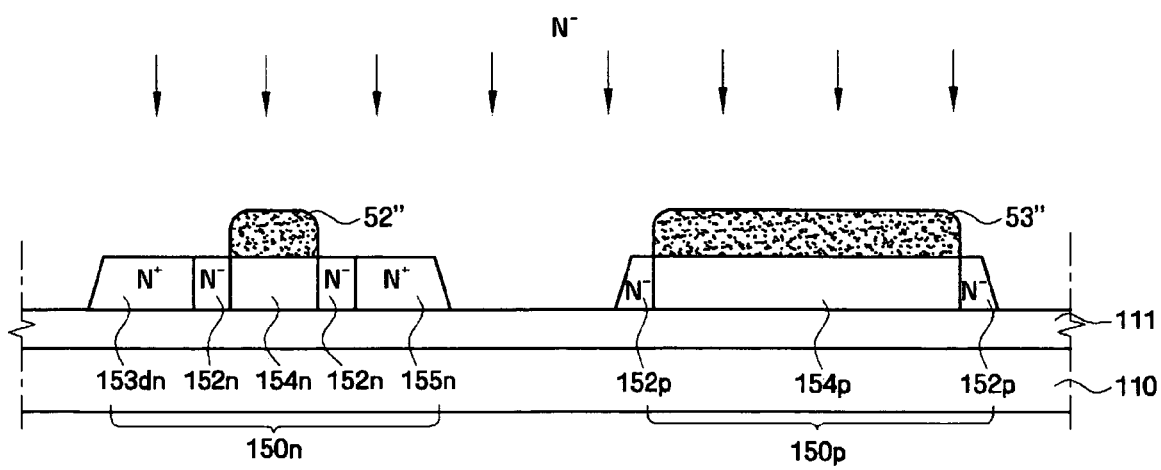

Referring to FIGS. 10 and 11, predetermined portions of side walls of photoresist patterns (51' of FIG. 8 and 52' and 53' of FIG. 9) are removed through oxygen plasma treatment. The predetermined portions correspond to widths of low concentration regions 152d, 152n and 152p to be formed in semiconductor layers 150d, 150n, and 150p, respectively. Subsequently, low concentration n-type impurities labeled $N^-$ are implanted into semiconductor layers 150d, 150n, and 150p using ashed photoresist patterns 51", 52", and 53" as ion implantation masks to form the low concentration regions 152d, 152n, and 152p. Eventually, the side walls of each of the ashed photoresist patterns 51", 52", and 53" are substantially aligned with the boundary plane of the low concentration regions 152d, 152n, and 152p and the channel regions 154d, 154n, and 154p. Hydrogen-diluted phosphine ($PH_3$), for example, may be used as a source gas for ion implantation, and the dosage and ion implant energy thereof may be adjusted appropriately according to device characteristics.

During formation of a PMOS source region (153p of FIG. 2) and a drain region (155p of FIG. 2), high concentration p-type impurities (P⁺), that is to say, approximately 10 times higher than the concentration of the n-type impurities having been implanted into the low concentration region 152p of the PMOS semiconductor layer 150p, are implanted into the low concentration region 152p. Since there a big difference between the n-type impurity concentration and the p-type impurity concentration, the low concentration region 152p of the PMOS semiconductor layer 150p affects little CMOS device characteristics.

Figure 12:
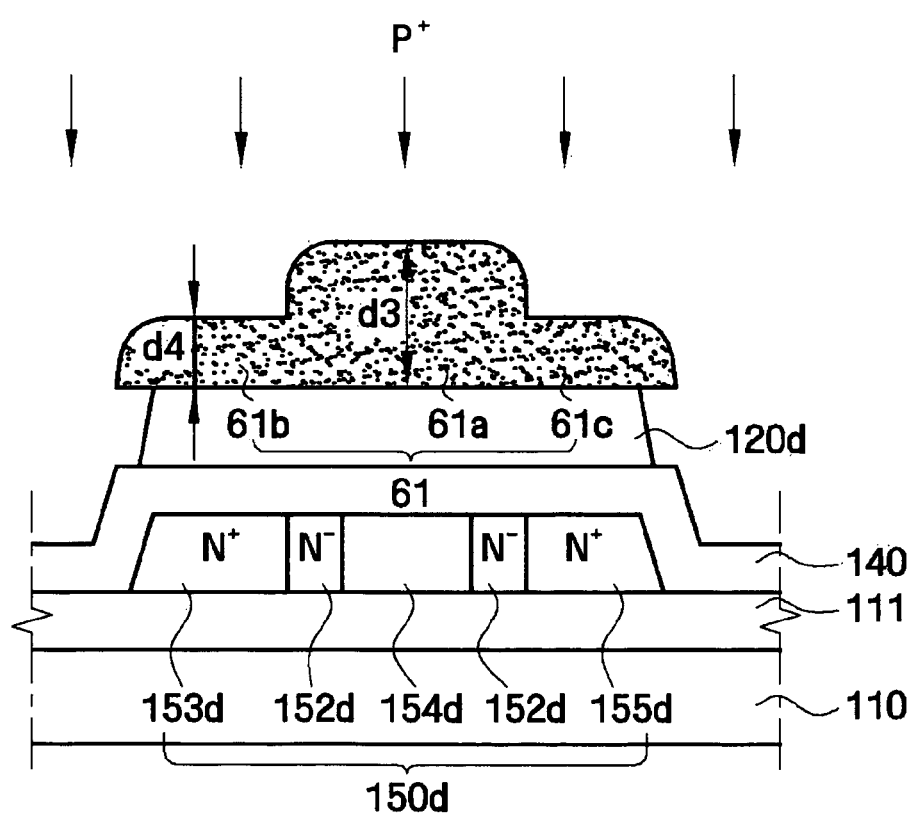
Figure 13:
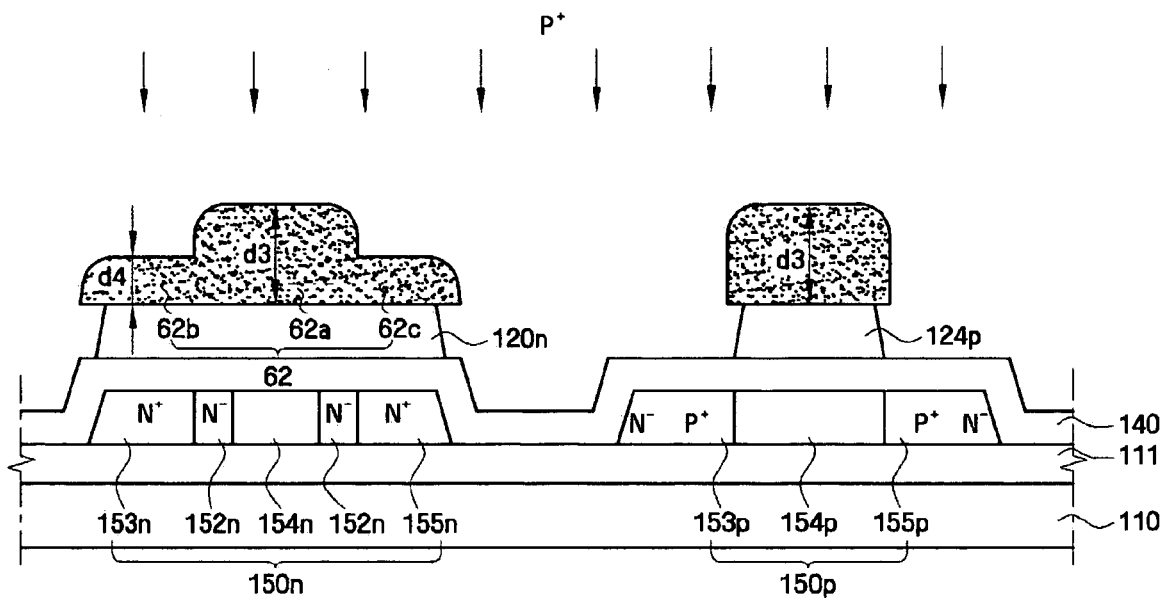

Referring to FIGS. 12 and 13, photoresist patterns (51" of FIGS. 10 and 52" and 53" of FIG. 11) formed on semiconductor layers 150d, 150n, and 150p are removed, and a gate insulating layer 140 is formed to cover the substrate 110 having semiconductor layers 150d, 150n, and 150p. Gate insulating layer 140 may be formed as a single layer made of, for example, silicon oxide or silicon nitride or a multiple layer (not shown) including silicon oxide and silicon nitride area sequentially stacked. Here, gate insulating layer 140 may have a thickness in a range of approximately, but not limited to, 600 to approximately 1200 Å.

Subsequently, a single layer made of Al, Cr and MO or an alloy thereof or a multiple layer is deposited on gate insulating layer 140 to form a gate conductor layer. In this case, the gate conductor layer may be formed to a thickness of, but not limited to, approximately 3200 Å, and may have a wide variety of thicknesses.

Next, a photoresist layer is formed on the gate conductor layer. Then, the resultant photoresist layer is exposed and developed through photolithography using a slit mask or a halftone mask (not shown) to form photoresist patterns 61, 62 and 63 having a predetermined shape. For example, photoresist patterns 61, 62 and 63 may be formed by patterning the photoresist layer in a predetermined shape, heating and shrinking so that the sectional shapes of photoresist patterns 61, 62 and 63 are trapezoidal. Alternatively, a molten photoresist layer may be heated, followed by patterning in a variety of sectional shapes including semispherical sections. Photoresist patterns 61, 62 and 63 are may be used not only as etch masks for patterning the gate conductor layer into gate electrodes but also as ion implantation masks for implanting p-type impurity ions.

Photoresist pattern 61 formed on the gate conductor layer in the pixel area has a double layered structure consisting of a high-level portion 61a having a third thickness d3, and low-level portions 61b and 61c having a fourth thickness d4, the low-level portions 61b and 61c being disposed at either side of the high-level portion 61a. The high-level portion 61a of photoresist pattern 61 overlaps with the channel region 154d formed within semiconductor layer 150d and the low concentration region 152d. The low-level portions 61b and 61c overlap the source region 153d and the drain region 155d formed within semiconductor layer 150d.

Of photoresist patterns 62 and 63 formed on the gate conductor layer in the drive area, photoresist pattern 62 for patterning the NMOS semiconductor layer 150n has a double layered structure consisting of a high-level portion 62a having a third thickness d3, and low-level portions 62b and 62c having a fourth thickness d4, the low-level portions 62b and 62c being disposed at either side of the high-level portion 62a. Photoresist pattern 63 overlapping a portion of the PMOS semiconductor layer 150p has a single layered structure consisting of a high-level portion having a third thickness d3. The high-level portion 62a of the double layered photoresist pattern 62 overlaps with the channel region 154n formed within the NMOS semiconductor layer 150n and the low concentration region 152n. A width of the single layered photoresist pattern 63 varies according to a width of a target channel region, that is, a channel region 154p, which is to be formed eventually in the PMOS semiconductor layer 150p.

Subsequently, the gate conductor layer is patterned using photoresist patterns 61, 62 and 63 formed on the gate conductor layer as etch masks to form a gate pattern 120d in the pixel area and an NMOS gate pattern 120n and a PMOS gate electrode 124p in the drive area. Here, gate patterns 120d and 120n and side walls of the PMOS gate electrode 124p may taper in order to ensure adhesion with respect to overlying layers to be formed in subsequent processes.

Next, high concentration p-type impurities labeled P⁺ are implanted into semiconductor layer 150p for a PMOS using the resultant products as ion implantation masks to form a source region 153p and a drain region 155p. Here, the double layered photoresist pattern 61 covering semiconductor layer 150d precludes-impurity ions from being injected into semiconductor layer 150d in the pixel area, while the double layered photoresist pattern 62 and the single layered photoresist pattern 63, covering the NMOS semiconductor layer 150n and PMOS semiconductor layer 150p in the drive area, preclude impurity ions from being injected into the NMOS semiconductor layer 150n and PMOS semiconductor layer 150p. Here, diborane ($B_2H_6$), for example, may be used as a source gas for ion implantation, and the dosage and ion implant energy thereof may be adjusted appropriately according to device characteristics.

Figure 14:
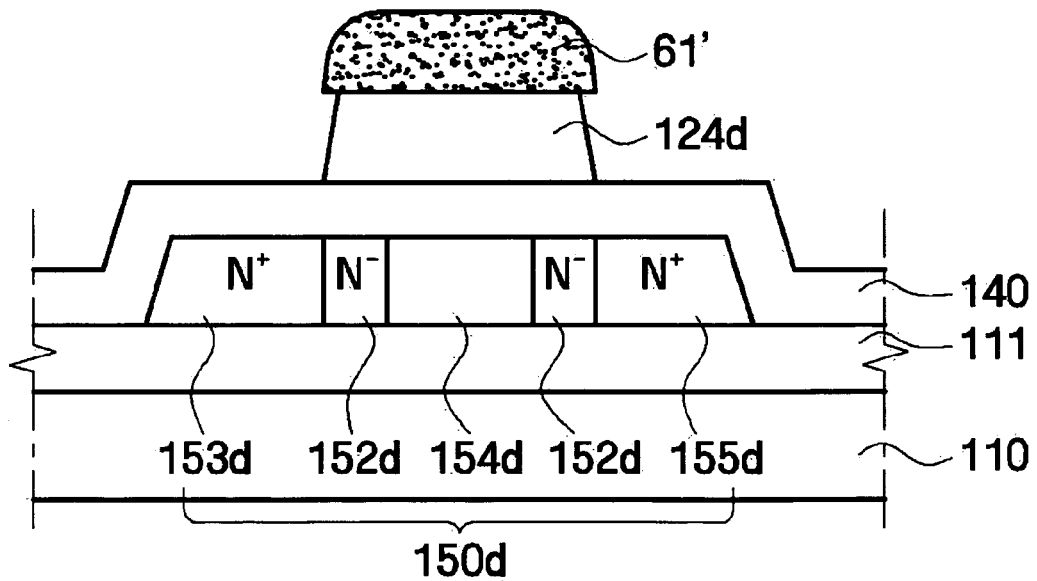
Figure 15:
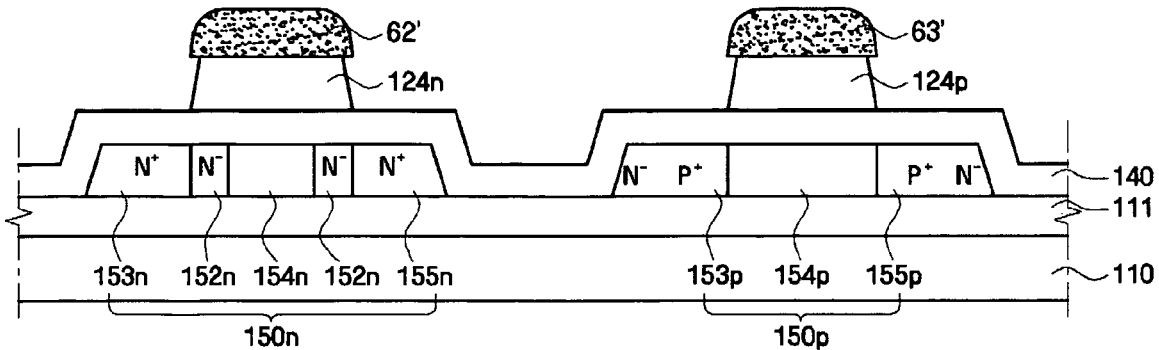

Referring to FIGS. 14 and 15, photoresist patterns (61 of FIGS. 12 and 62 and 63 of FIG. 13) are etched by ashing through oxygen plasma treatment until the low-level portions (61b and 61c of FIGS. 12 and 62b and 62c of FIG. 13) are removed. Subsequently, gate patterns (120d of FIGS. 12 and 120n of FIG. 13) are patterned using ashed photoresist patterns 61', 62', and 63' as etch masks to form a pixel area and NMOS gate electrodes 124d and 124n. Here, the NMOS gate electrodes 124d and 124n may overlap the channel regions 154d and 154n formed in semiconductor layers 150d and 150n overlaying gate electrodes 124d and 124n and side walls thereof may taper to ensure adhesion with respect to overlying layers to be formed in subsequent processes.

Figure 16:
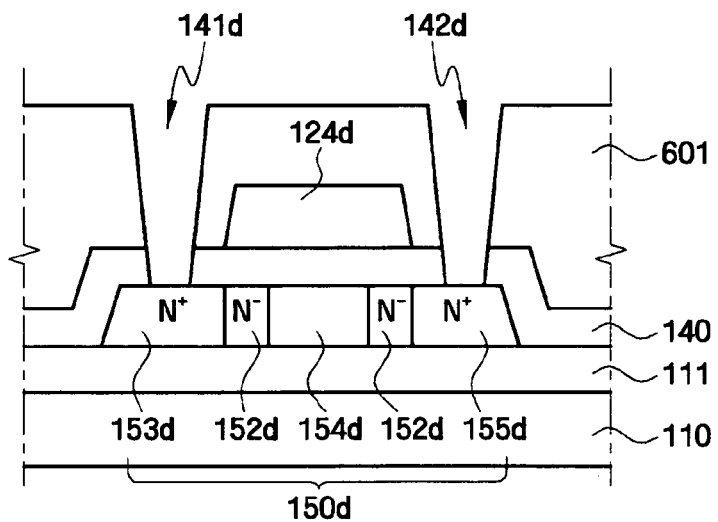
Figure 17:
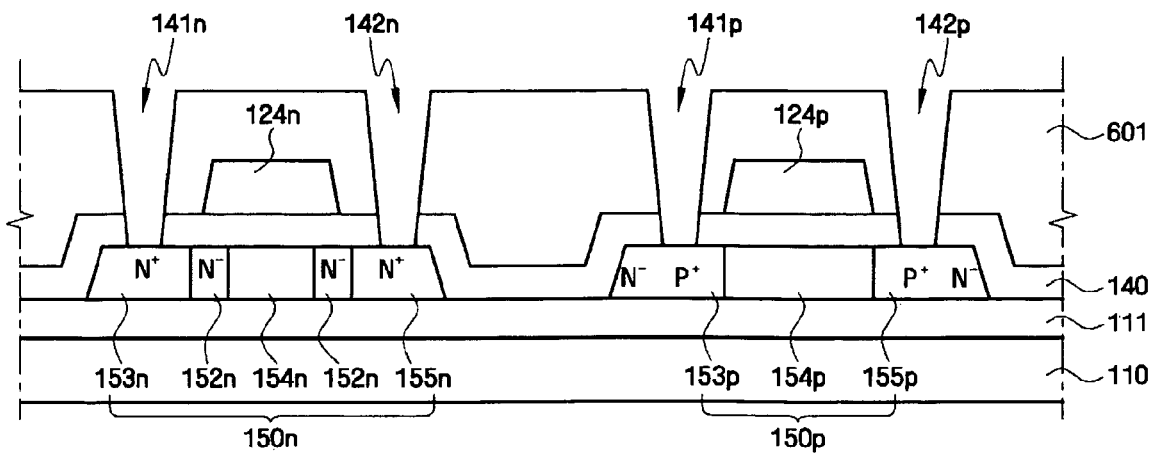

Referring to FIGS. 16 and 17, photoresist patterns (61' of FIG. 14, and 62' and 63' of FIG. 15) formed on gate electrodes 124d, 124n and 124p are removed, and a gate insulating layer is formed to cover the substrate 110 having gate electrodes 124d, 124n, and 124p to form a first interlayer insulating layer 601. Next, the first interlayer insulating layer 601 is patterned by photolithography using a mask to form first and second contact holes 141n, 141p, 142n and 142p exposing source and drain regions 153n, 153p, 155n and 155p.

Figure 18:
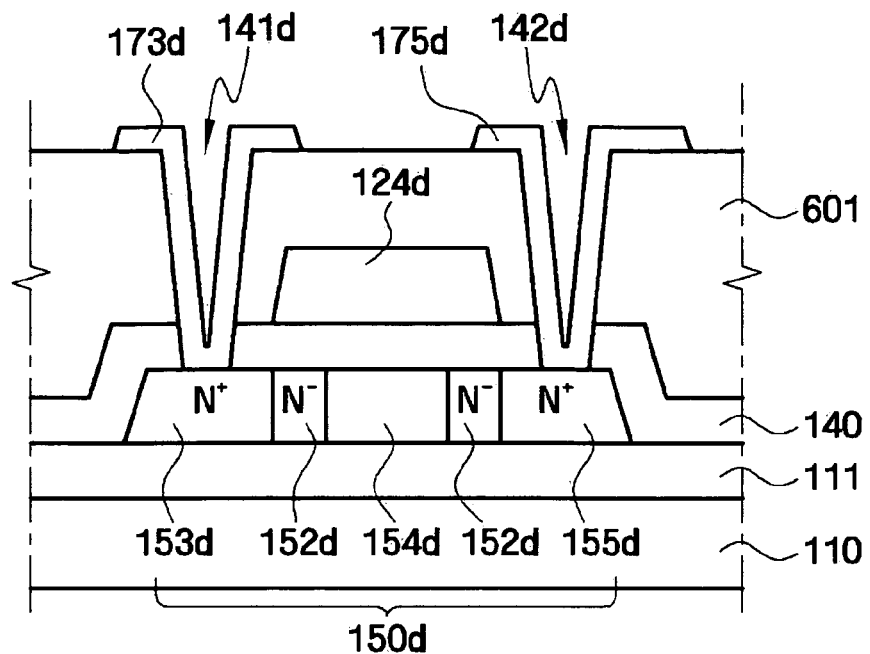
Figure 19:
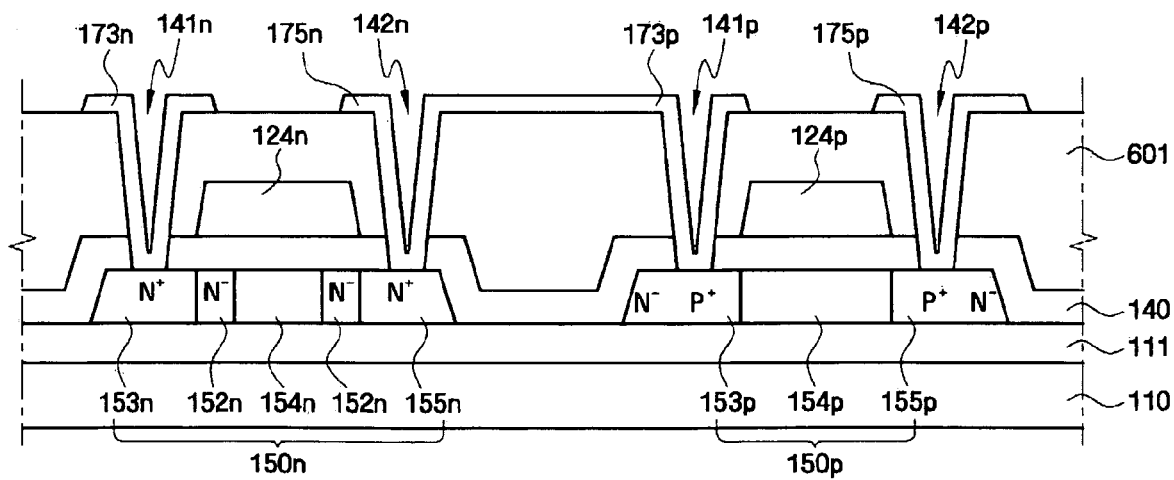

Referring to FIGS. 18 and 19, a data conductor layer is formed on the first interlayer insulating layer 601, followed by patterning through photolithography using a mask to form a data line (not shown), source electrodes 173d, 173n and 173p and drain electrodes 175d, 175n and 175p. The source electrodes 173n and 173p are connected with the source regions 153n and 153p through the first contact holes 141n and 141p, respectively, and the drain electrodes 175n and 175p are connected with the drain regions 155n and 155p through the second contact holes 142n and 142p, respectively.

Figure 20:
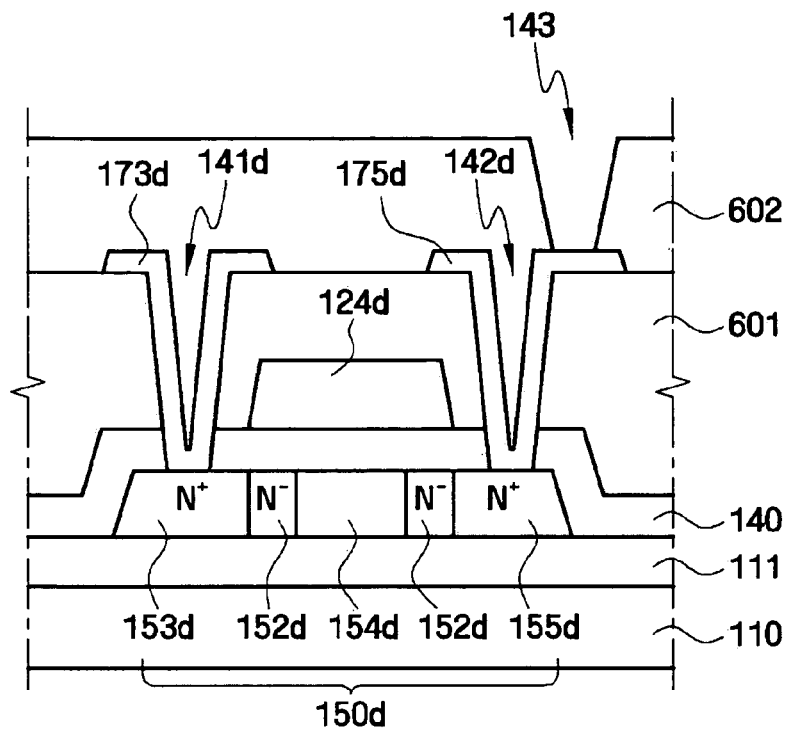
Figure 21:
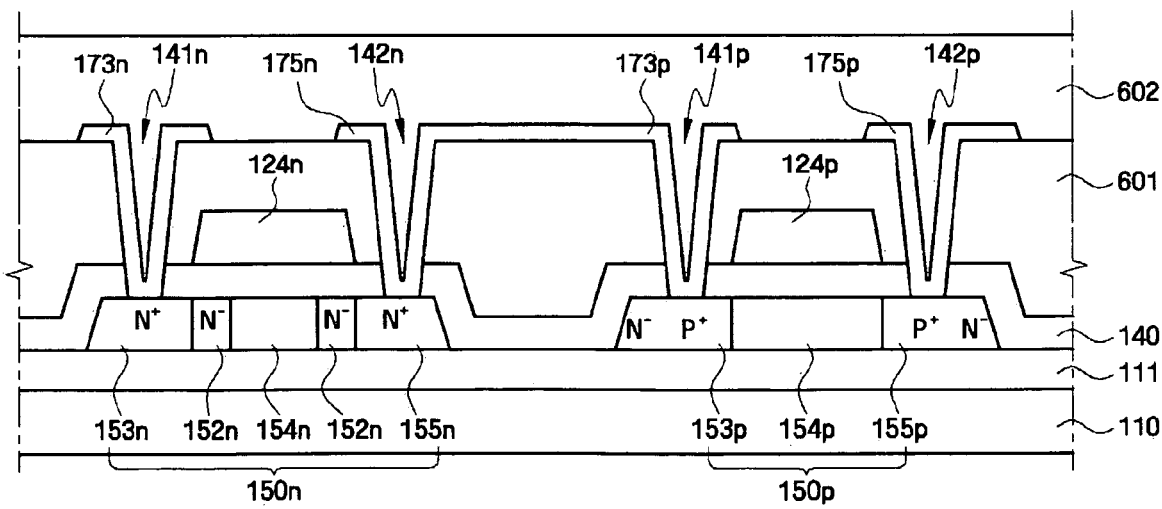

Referring to FIGS. 20 and 21, a photosensitive organic material having a good flatness characteristic, or a low dielectric insulating material such as a-Si:C:O and a-Si:O:F formed by plasma enhanced chemical vapor deposition (PECVD) is deposited on the first interlayer insulating layer 601 having the source electrodes 173d, 173n and 173p and drain electrodes 175d, 175n and 175p, to form a second interlayer insulating layer 602. Then, the second interlayer insulating layer 602 is patterned through photolithography using a mask to form a third contact hole 143 exposing a drain electrode 175d in the pixel area.

Finally, referring back to FIGS. 2 and 3, a transparent conductive material such as indium tin oxide (ITO) or indium zinc oxide (IZO) is deposited on the second interlayer insulating layer 602 having the third contact hole 143 and patterned to form a pixel electrode 190, and auxiliary pads (not shown) for electric connection of a plurality of signal lines. The pixel electrode 190 is electrically connected with the drain electrode 175d through the third contact hole 143. The auxiliary pads are electrically connected with the corresponding data lines and gate lines through fourth and fifth contact holes (not shown) formed over the first and second interlayer insulating layers 601 and 602 and gate insulating layer 140, respectively.

Next, a method of fabricating a thin film transistor (TFT) substrate according to another embodiment of the present invention will be described. This method of fabricating the TFT substrate is the same as that of the previously described TFT substrate except that a gate electrode in a pixel area and an NMOS gate electrode in a drive area overlap channel regions formed in each respective semiconductor layer. Only differences between the two embodiments will be described with reference to FIG. 4 through 11 and 22 through 31. FIGS. 22, 24, 26, 28 and 30 are cross-sectional views of intermediate structures in a pixel area in various steps to manufacture the TFT substrate according to another embodiment of the present invention, and FIGS. 23, 25, 27, 29 and 31 are cross-sectional views of intermediate structures in a pixel area in various steps to manufacture the TFT substrate according to another embodiment of the present invention.

First, referring to FIG. 6 through 11, a blocking layer 111 is formed on a transparent insulating substrate 110. On the NMOS block layer 111 in the pixel area and the drive area are formed n-type low concentration regions 152d and 152n and semiconductor layers 150d and 150n connected with the n-type low concentration regions 152d and 152n and including source regions 153d and 153n and drain regions 155d and 155n implanted high concentration n-type impurities label. On the PMOS blocking layer 111 in the drive area are formed p-type high concentration source region 153p and drain region 155p doped into side walls of a channel region 154p, and a semiconductor layer 150p connected with the source region 153p and the drain region 155p and including an n-type low concentration region 152p.

Figure 22:
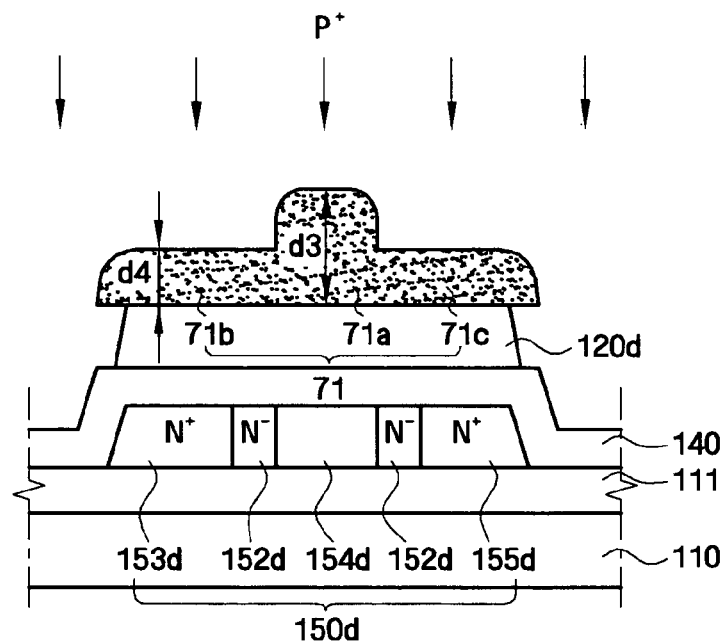
FIGS. 22, 24, 26, 28 and 30 are cross-sectional views of intermediate structures in a pixel area in various steps to manufacture the TFT substrate according to another embodiment of the present invention.
Figure 23:
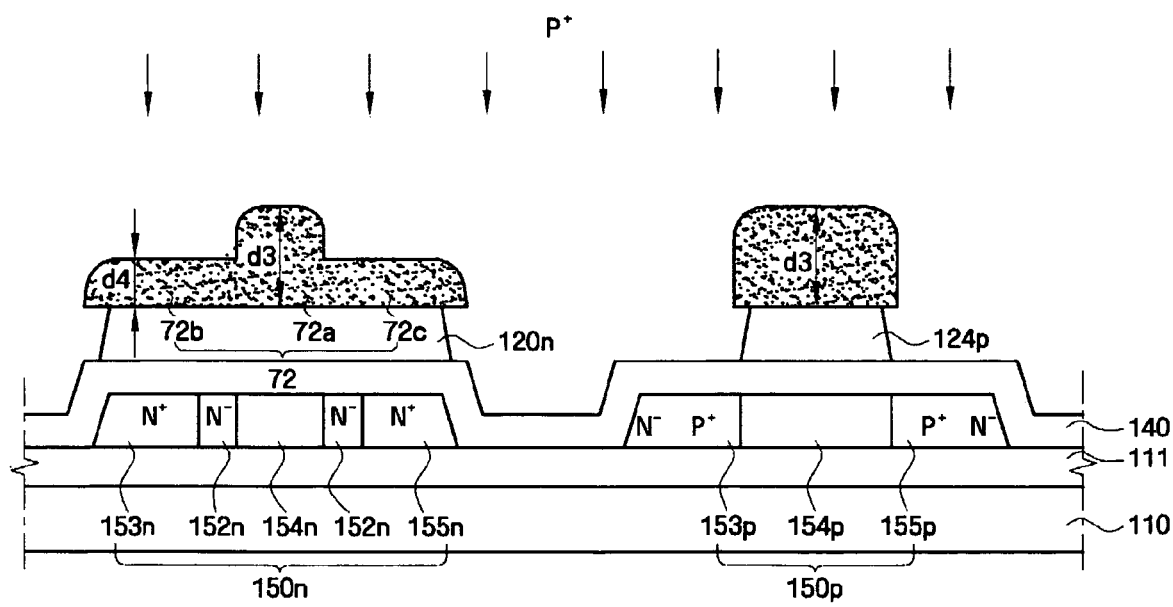
FIGS. 23, 25, 27, 29 and 31 are cross-sectional views of intermediate structures in a pixel area in various steps to manufacture the TFT substrate according to another embodiment of the present invention.

Referring to FIG. 22, a gate insulating layer 140 and a gate conductor layer are sequentially formed to cover a substrate 110 having semiconductor layers 150d, 150n, and 150p.

Subsequently, a photoresist layer is formed on the gate conductor layer. Then, the resultant photoresist layer is exposed and developed through photolithography using a slit mask or a halftone mask (not shown) to form photoresist patterns 71, 72 and 73 having a predetermined shape. Photoresist pattern 71 formed on the gate conductor layer in the pixel area has a double layered structure consisting of a high-level portion 71a having a third thickness d3, and low-level portions 71b and 71c having a fourth thickness d4, the low-level portions 71b and 71c being disposed at either side of the high-level portion 71a. The high-level portion 71a of photoresist pattern 71 overlaps with a channel region 154d formed in a semiconductor layer 150d. The low-level portions 71b and 71c overlap the low concentration region 152d formed in semiconductor layer 150d and the source and drain regions 153d and 155d.

Of photoresist patterns 72 and 73 formed on the gate conductor layer in the drive area, photoresist pattern 72 overlapping the NMOS semiconductor layer 150n has a double layered structure consisting of a high-level portion 72a having a third thickness d3, and low-level portions 72b and 72c having a fourth thickness d4, the low-level portions 72b and 72c being disposed at either side of the high-level portion 72a. Photoresist pattern 73 overlapping a portion of the PMOS semiconductor layer 150p has a single layered structure consisting of a high-level portion having a third thickness d3. The high-level portion 72a of photoresist patterns 72 overlaps the channel region 154n formed in the NMOS semiconductor layer 150n, the low-level portions 72b and 72c overlap the low concentration region 152n formed in semiconductor layer 150n, and source and drain regions 153n and 155n, respectively. In addition, the single layered photoresist pattern 73 varies according to the width of the target channel region, that is, a channel region 154p, which is to be formed eventually in the PMOS semiconductor layer 150p.

Subsequently, the gate conductor layer is patterned using photoresist patterns 71, 72 and 73 formed on the gate conductor layer as etch masks to form a gate pattern 120d in the pixel area and an NMOS gate pattern 120 and a PMOS gate electrode 124p in the drive area. Here, gate patterns 120d and 120n and side walls of the PMOS gate electrode 124p may taper in order to ensure adhesion with respect to overlying layers to be formed in subsequent processes.

Next, high concentration p-type impurities labeled P$^+$ are implanted into semiconductor layer 150p for a PMOS using the resultant products as ion implantation masks to form a source region 153p and a drain region 155p.

Figure 24:
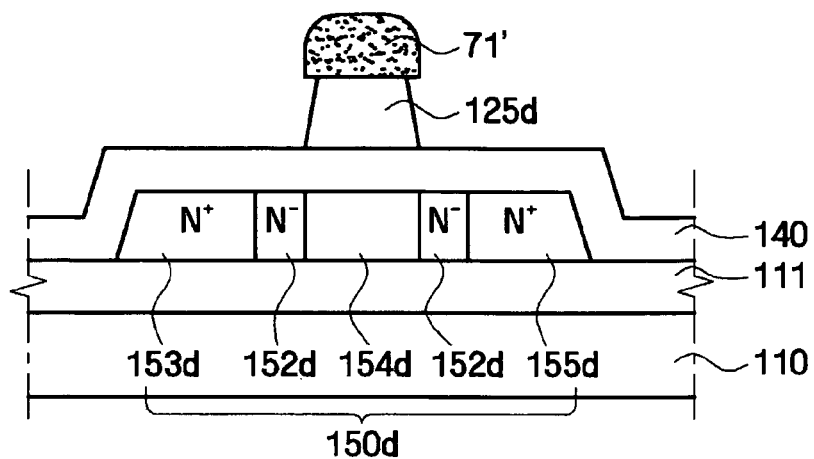
Figure 25:
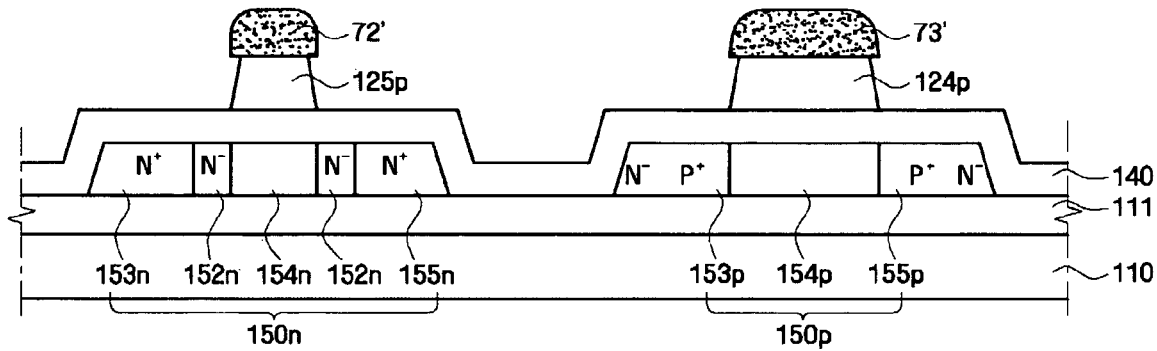

Referring to FIGS. 24 and 25, photoresist patterns (71 of FIGS. 22 and 72 and 73 of FIG. 23) are etched by ashing through oxygen plasma treatment until the low-level portions (71b and 71c of FIGS. 22 and 72b and 72c of FIG. 23) are removed.

Subsequently, gate patterns (120d of FIG. 22 and 120n of FIG. 23) are patterned using ashed photoresist patterns 71', 72', and 73' as etch masks to form a pixel area and NMOS gate electrodes 125d and 125n, respectively. Here, gate electrodes 125d and 125n may overlap the channel regions 154d and 154n formed in semiconductor layers 150d and 150n overlaying gate electrodes 125d and 125n and side walls thereof may taper to ensure adhesion with respect to overlying layers to be formed in subsequent processes.

Figure 26:
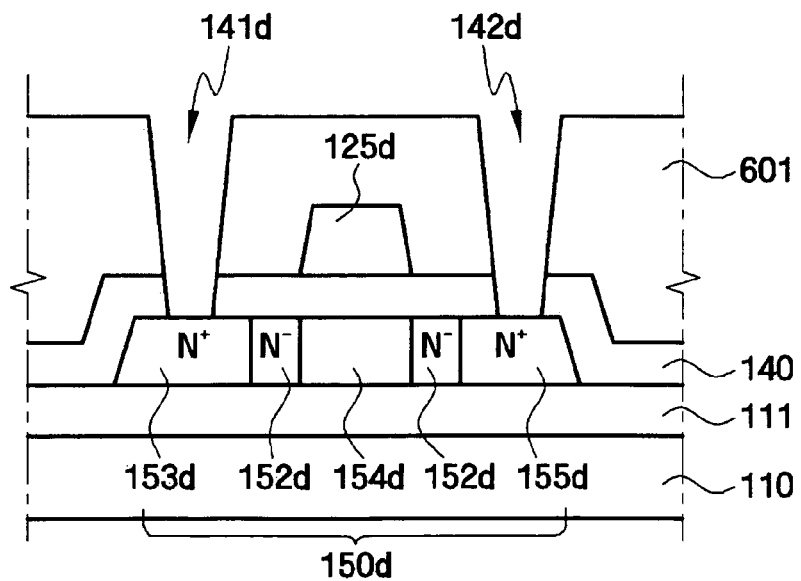
Figure 27:
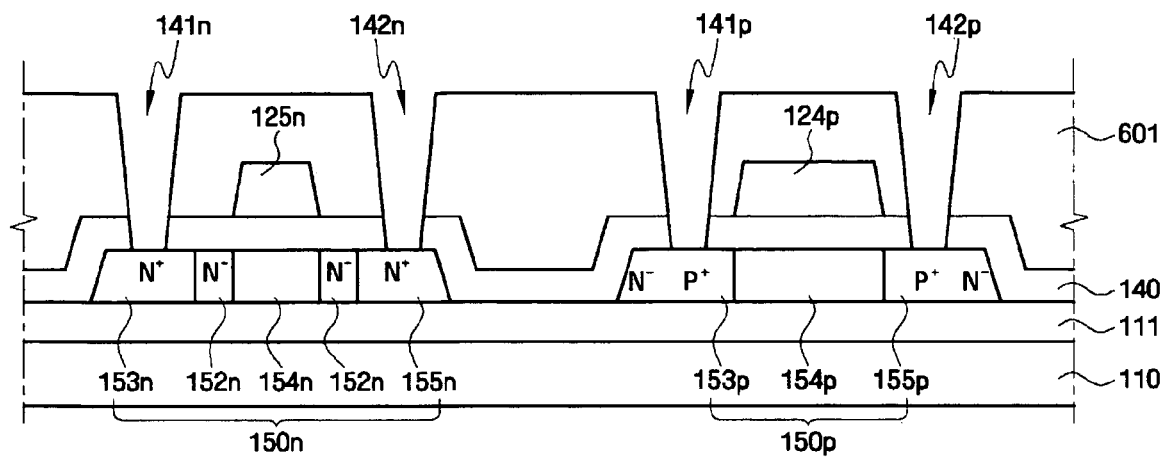

Next, referring to FIGS. 26 and 27, photoresist patterns (71' of FIG. 24, and 72' and 73' of FIG. 25) are removed from gate electrodes 125d, 125n and 124p, and a first interlayer insulating layer 601 is formed on the resultant gate electrodes 125d, 125n and 124p without photoresist patterns, to form first and second contact holes 141n, 141p, 142n and 142p.

Figure 28:
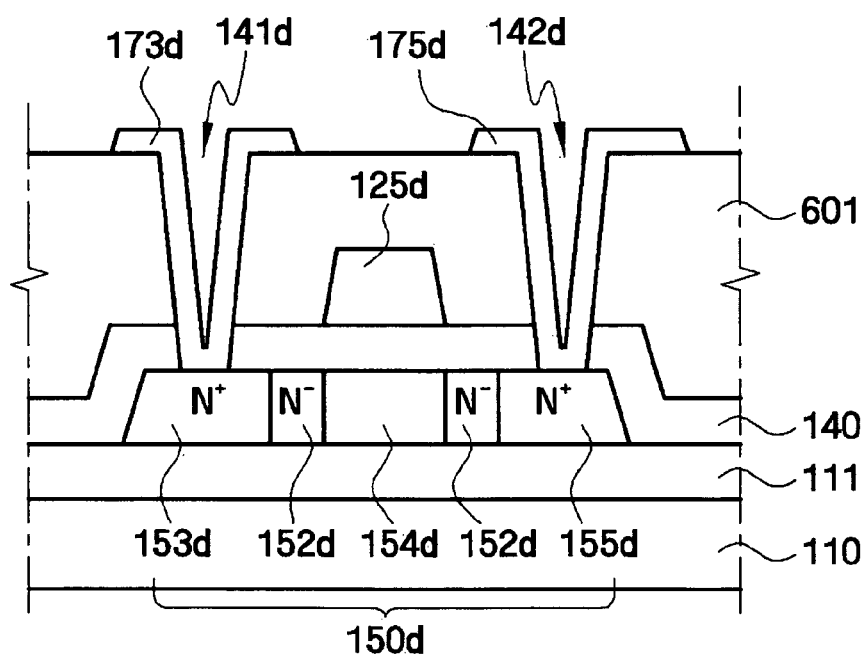
Figure 29:
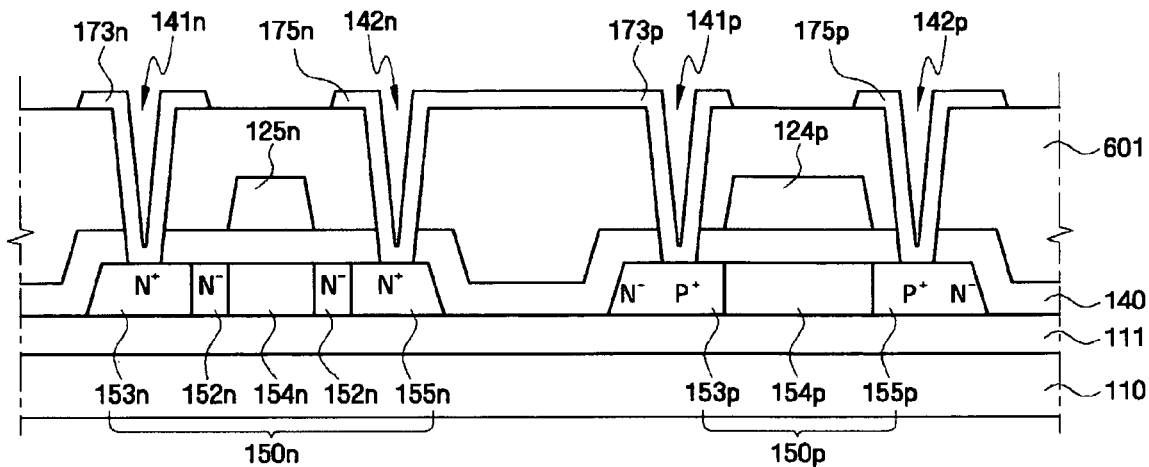

Referring to FIGS. 28 and 29, a data conductor layer is formed on the first interlayer insulating layer 601, followed by patterning through photolithography using a mask to form a data line (not shown), source electrodes 173d, 173n and 173p and drain electrodes 175d, 175n and 175p connected with the source regions 153n and 153p and the drain regions 155n and 155p through the first contact holes 141n and 141p and the second contact holes 142n and 142p, respectively.

Figure 30:
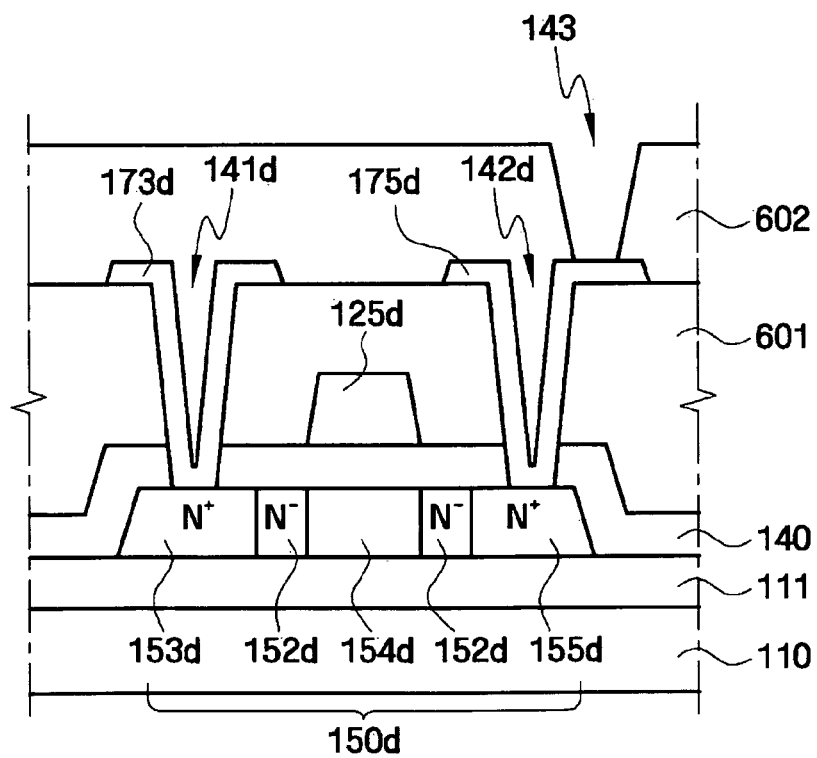
Figure 31:
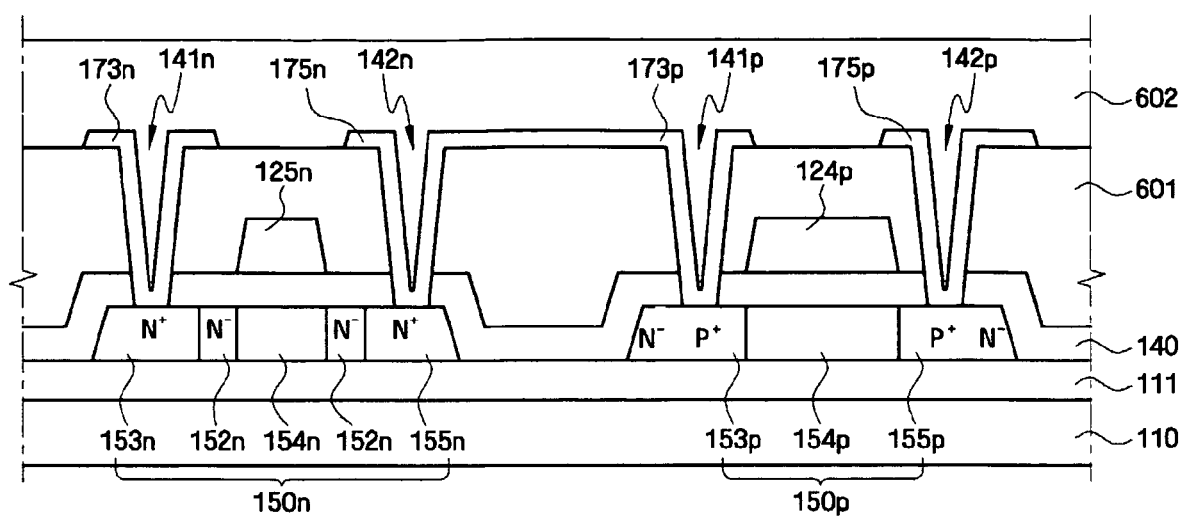

Referring to FIGS. 30 and 31, a second interlayer insulating layer 602 is formed on the first interlayer insulating layer 601 having the data line, the source electrodes 173d, 173n and 173p and the drain electrodes 175d, 175n and 175p, and patterned to form a third contact hole 143 exposing a drain electrode 175d in the pixel area.

Finally, referring back to FIGS. 4 and 5, a transparent conductive material such as indium tin oxide (ITO) or indium zinc oxide (IZO) is deposited on the second interlayer insulating layer 602 having the third contact hole 143 and patterned to form a pixel electrode 190, and auxiliary pads (not shown) for electric connection of a plurality of signal lines.

While the invention shows and describes n-type impurity ions injected into low concentration regions, source and drain regions in the drive area and NMOS semiconductor layers and p-type impurity ions injected into source and drain regions in PMOS semiconductor layers, it is apparent that the invention can also be applied to a case of injecting of opposite type impurity ions to the respective regions.

As described above, according to the present invention, a low concentration region, a source region and a drain region can be formed within a semiconductor layer using a single mask. In addition, since high concentration impurity ions are directly doped into the semiconductor layer, ion implantation can be performed at relatively low ion implant energy. Further, a gate overlapped lightly doped drain structure (GOLDD) structure may be achieved without additional processing steps, thereby simplifying the fabrication method and reducing the production cost.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. A method for fabricating a thin film transistor (TFT) substrate comprising: providing a substrate having a semiconductor layer made of polysilicon, the semiconductor layer including a channel region separating an adjacent first low concentration region and a source region, and an adjacent second low concentration region and a drain region then sequentially forming a gate insulating layer and a conductive layer on the substrate and patterning the conductive layer to form a gate electrode.

2. The method of claim 1, wherein the providing of the substrate comprises: forming a photoresist pattern on the substrate having a polysilicon layer, the photoresist pattern including a high-level portion overlapping the channel region and the low concentration region and a low-level portion disposed adjacent to both sides of the high-level portion and overlapping the source region/drain region; patterning the polysilicon layer using the photoresist pattern as an etch mask to form the semiconductor layer; removing the low-level portion of the photoresist pattern to form a first ion implantation mask structure; implanting high concentration impurity ions into the semiconductor layer using the first ion implantation mask structure as an ion implantation mask to form the source region/drain region; substantially aligning side walls of the photoresist pattern from which the low-level portion removed has been removed with the boundary between the low concentration region of the semiconductor layer and the channel region to form a second ion implantation mask structure; and implanting low concentration impurity ions into the semiconductor layer using the second ion implantation mask structure as an ion implantation mask to form the low concentration region.

3. The method of claim 2, wherein the forming of the gate electrode comprises: forming the photoresist pattern overlapping the channel region formed in the semiconductor layer and the low concentration region on the conductive layer; and patterning the conductive layer using the photoresist pattern as an etch mask to form the gate electrode.

4. The method of claim 2, wherein the forming of the gate electrode comprises:
forming the photoresist pattern overlapping the channel region formed in the semiconductor layer on the conductive layer; and
patterning the conductive layer using the photoresist pattern as an etch mask to form the gate electrode.

5. The method of claim 1, further comprising forming a blocking layer between the semiconductor layer and the substrate.

6. A method for fabricating a thin film transistor (TFT) substrate comprising:
providing a substrate having a first semiconductor layer made of polysilicon, the semiconductor layer including a channel region separating an adjacent first low concentration region of a first conductivity type and a source region, and an adjacent second low concentration region of the first conductivity type and a drain electrode; then
sequentially forming a gate insulating layer and a conductive layer on the substrate and forming a first photoresist pattern and a second photoresist pattern on the conductive layer, wherein the first photoresist pattern overlaps the first semiconductor layer and the second photoresist pattern overlaps a channel region formed in the second semiconductor layer;
patterning the conductive layer using the first and second photoresist patterns as etch masks to form first and second gate electrodes; and
implanting high concentration impurity ions of a second conductivity type into the second semiconductor layer using the second photoresist pattern as ion implantation masks to from source and drain regions.

7. The method of claim 6, wherein the providing of the substrate comprises:
forming a first photoresist pattern and a second photoresist pattern on the substrate having a polysilicon layer, the first photoresist pattern including a high-level portion overlapping the channel region of the first semiconductor layer and the low concentration region and a low-level portion disposed adjacent to both sides of the high-level portion and overlapping the source region/drain region;
patterning the polysilicon layer using the first and second photoresist patterns as etch masks to form the first and second semiconductor layers;
ashing the first and second photoresist patterns until the low-level portion of the first photoresist pattern is removed to form the first ion implantation mask structure;
implanting the high concentration impurity ions of a first conductivity type into the first semiconductor layer using the first ion implantation mask structure as ion implantation masks to form the source region/drain region of a first conductivity type;
ashing the first and second photoresist patterns until both side walls of the ashed first photoresist pattern is substantially aligned with the boundary between the low concentration region of a first conductivity type and the channel region to form a second ion implantation mask structure; and
implanting low concentration impurity ions of a first conductivity type into the first and second semiconductor layers using the second ion implantation mask structure as an ion implantation mask to form the low concentration region.

8. The method of claim 7, wherein the high-level portion of the first photoresist pattern has substantially the same height as that of the second photoresist pattern.

9. The method of claim 6, wherein the photoresist pattern overlapping the first semiconductor layer includes a high-level portion overlapping the channel region of the first semiconductor layer and the low concentration region of a first conductivity type and a low-level portion disposed adjacent to both sides of the high-level portion and overlapping the source region/drain region.

10. The method of claim 9, after forming the source region/drain region in the second semiconductor layer, further comprising forming a first gate electrode by removing the low-level portion of the photoresist pattern overlapping the first disposed adjacent to both sides of the high-level portion and overlapping the semiconductor layer and patterning the first gate pattern as an etch mask.

11. The method of claim 6, wherein the photoresist pattern overlapping the first semiconductor layer includes a high-level portion overlapping the channel region of the first semiconductor layer and a low-level portion disposed adjacent to both sides of the high-level portion and overlapping the low concentration region of a first conductivity type and with the source region/drain region.

12. The method of claim 11, after forming the source region/drain region in the second semiconductor layer, further comprising forming a first gate electrode by removing the low-level portion of the photoresist pattern overlapping the first disposed adjacent to both sides of the high-level portion and overlapping the semiconductor layer and patterning the first gate pattern as an etch mask.

13. The method of claim 6, wherein the first conductivity is an n-type and the second conductivity type is a p-type.

14. The method of claim 6, further comprising forming a blocking layer between each of the first and second semiconductor layers and the substrate.

* * * * *